United States Patent
Braeckelmann et al.

(10) Patent No.: US 8,202,798 B2
(45) Date of Patent: Jun. 19, 2012

(54) IMPROVEMENTS FOR REDUCING ELECTROMIGRATION EFFECT IN AN INTEGRATED CIRCUIT

(75) Inventors: Greg Braeckelmann, Grenoble (FR); Hisao Kawasaki, Yokohama (JP); Marius Orlowski, Meylan (FR); Emmanuel Petitprez, Grenoble (FR)

(73) Assignee: Freescale Semiconductor, Inc., Austin, TX (US)

( * ) Notice: Subject to any disclaimer, the term of this patent is extended or adjusted under 35 U.S.C. 154(b) by 172 days.

(21) Appl. No.: 12/675,242

(22) PCT Filed: Sep. 20, 2007

(86) PCT No.: PCT/IB2007/054335
§ 371 (c)(1),
(2), (4) Date: Feb. 25, 2010

(87) PCT Pub. No.: WO2009/037531
PCT Pub. Date: Mar. 26, 2009

(65) Prior Publication Data
US 2010/0314769 A1    Dec. 16, 2010

(51) Int. Cl.
*H01L 21/4763* (2006.01)
(52) U.S. Cl. . 438/629; 438/627; 438/653; 257/E23.011; 257/758; 257/774
(58) Field of Classification Search ............ 257/E21.585, 257/E23.011, E23.01, 758, 762, 774, E23.039, 257/E23.052, E23.125, 692, 693, 666, 698, 257/734, 737, 738, 784, 790; 438/627, 629, 438/643, 653, 106, 112, 113, 117, 124–127, 438/462
See application file for complete search history.

(56) References Cited

U.S. PATENT DOCUMENTS

| 5,930,667 | A | 7/1999 | Oda |
| 6,156,655 | A * | 12/2000 | Huang et al. ............. 438/687 |
| 6,180,518 | B1 * | 1/2001 | Layadi et al. ............. 438/639 |
| 6,380,075 | B1 | 4/2002 | Cabral, Jr. et al. |
| 6,417,572 | B1 | 7/2002 | Chidambarrao et al. |
| 6,552,427 | B2 * | 4/2003 | Moden ..................... 257/692 |
| 6,657,304 | B1 * | 12/2003 | Woo et al. ................ 257/758 |
| 6,762,597 | B1 | 7/2004 | Hau-Riege et al. |
| 6,831,003 | B1 * | 12/2004 | Huang et al. ............. 438/627 |

(Continued)

FOREIGN PATENT DOCUMENTS

JP          2001044196 A      2/2001

(Continued)

OTHER PUBLICATIONS

Chang C et al: "Electromigration Resistance in a Short Three-Contact Interconnect Tree" Journal of Applied Physics, New York, US, vol. 99, No. 9, May 19, 2006.

(Continued)

*Primary Examiner* — Chris Chu

(57) ABSTRACT

An integrated circuit comprising one or more dielectric layers the or each dielectric layer being provided with one or more interconnects wherein the interconnect comprises metallic atoms moving from a first region of the interconnect to a second region of the interconnect when a current flows, characterized in that the interconnect comprises a donor zone in the first region of the interconnect for providing metallic atoms in order to compensate for movement of atoms from the first region and a receptor zone at the second region of the interconnect for receiving metallic atoms in order to compensate for movement of atoms to the second region.

20 Claims, 4 Drawing Sheets

U.S. PATENT DOCUMENTS

| | | | | |
|---|---|---|---|---|
| 6,836,017 B2 * | 12/2004 | Ngo et al. | | 257/751 |
| 6,878,615 B2 * | 4/2005 | Tsai et al. | | 438/618 |
| 6,887,786 B2 | 5/2005 | Zhang et al. | | |
| 6,919,636 B1 * | 7/2005 | Ryan | | 257/751 |
| 6,951,812 B2 * | 10/2005 | Jiang et al. | | 438/643 |
| 6,953,742 B2 | 10/2005 | Chen et al. | | |
| 6,991,709 B2 | 1/2006 | Gopalraja | | |
| 7,018,515 B2 | 3/2006 | Gung et al. | | |
| 7,067,925 B2 * | 6/2006 | Abell | | 257/774 |
| 7,208,418 B1 * | 4/2007 | Okada et al. | | 438/696 |
| 7,244,674 B2 * | 7/2007 | Li et al. | | 438/643 |
| 7,271,089 B2 * | 9/2007 | Sandu et al. | | 438/638 |
| 7,612,452 B2 * | 11/2009 | Ohba et al. | | 257/751 |
| 7,619,304 B2 * | 11/2009 | Bauer et al. | | 257/678 |
| 7,701,060 B2 * | 4/2010 | Tada et al. | | 257/758 |
| 7,888,179 B2 * | 2/2011 | Kagaya et al. | | 438/113 |
| 7,928,006 B2 * | 4/2011 | Besling | | 438/643 |
| 2002/0093057 A1 * | 7/2002 | Marathe et al. | | 257/359 |
| 2003/0218263 A1 * | 11/2003 | Blaszczak et al. | | 257/788 |
| 2005/0151246 A1 * | 7/2005 | Daeche et al. | | 257/723 |
| 2006/0180934 A1 | 8/2006 | Liu et al. | | |
| 2008/0265383 A1 * | 10/2008 | Brunnbauer et al. | | 257/659 |

FOREIGN PATENT DOCUMENTS

| | | |
|---|---|---|
| WO | 01/15220 A1 | 3/2001 |
| WO | 02/069380 A2 | 9/2002 |

OTHER PUBLICATIONS

International Search Report and Written Opinion correlating to PCT/IB2007/054335 dated May 30, 2008.

* cited by examiner

IMPROVEMENTS FOR REDUCING ELECTROMIGRATION EFFECT IN AN INTEGRATED CIRCUIT

FIELD OF THE INVENTION

This invention relates to improvements for reducing electromigration effect in an integrated circuit and more particularly describes a new method and apparatus for integrated circuit layout to reduce electromigration failures.

BACKGROUND OF THE INVENTION

In an integrated circuit, many different electronic devices or components such as transistors or capacitances are formed in or on a specific substrate, which generally has a planar configuration. The layer may be a metal dielectric or any other type of material appropriate to the circuit design. The electrical connections between the electronic devices located on the substrate or on a surface of a dielectric layer occurs through a network of metal interconnects or interconnections. Generally, complex integrated circuits are formed with different metal layers or levels. The network of interconnects may include intra-level connections also called metal lines which make connections in the same layer and inter-level connections called vias, which, are metal links which connect consecutive metals layers.

Metal lines and vias represent metallization layers also called interconnections or interconnects of an integrated circuit. Interconnections may be made of Copper, Aluminium, or any other conducting material. Most recent integrated circuits use Copper as the interconnection material as Copper has a better electrical conductivity and a better electromigration resistance than Aluminium. Integrated circuit interconnects generally comprise a diffusion barrier liner in order to separate vias of metal material from layers of dielectric material located above and below the vias. The barrier liner is made of a specific material impermeable to Copper or Aluminium for example, in order to prevent the diffusion of metal material into dielectric material.

A phenomenon called electromigration is a well-know problem in electronic integrated circuits. Electromigration occurs when a current flows in an integrated circuit. Electromigration relates to displacement of atoms in an interconnect such as metal lines or vias. The movement of atoms produces a void of atoms of Copper for example at one part of the interconnect and accumulation of Copper at another part of the interconnect. This movement of atoms can produce weakness in the interconnect and may ultimately lead to failure: either due to open-circuits caused by voids, or by short-circuits caused by Copper accumulation and cracking of the dielectric material.

When electromigration occurs in an electronic circuit, which comprises a barrier liner, two effects are visible. Firstly in the interconnect, movement of atoms leads to voids of atoms above or below the barrier liner, depending on current flow and secondly movement of atoms also leads to accumulation of atoms below or above the barrier liner. This movement of atoms in the interconnect may produce failures in the electronic circuit as above. In short, barrier liners at the via bottom stop the movements of the metal atoms. Thus, by far the most electromigration failure sites are located at the barrier liner.

In order to avoid the voids and accumulations of atoms, U.S. Pat. No. 6,380,075 discloses a solution using a specific process called the "punch through barrier deposition process" where the barrier liner is only made on the sidewalls of vias. The bottom of the via is free of barrier liner. Thus, when a current flows in the electronic circuit, atoms of Copper are no longer stopped and accumulated at the barrier liner. Therefore, electromigration is reduced. However the problem of accumulation of atoms at the other side of the interconnect still remains unresolved and leads to further electromigration degradation problems.

SUMMARY OF THE INVENTION

An object of the present invention is to provide a method and apparatus which overcomes at least some of the problems associated with the prior art.

According to one aspect of the invention there is provided a method and an apparatus for integrated circuit layout as described in the accompanying claims.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
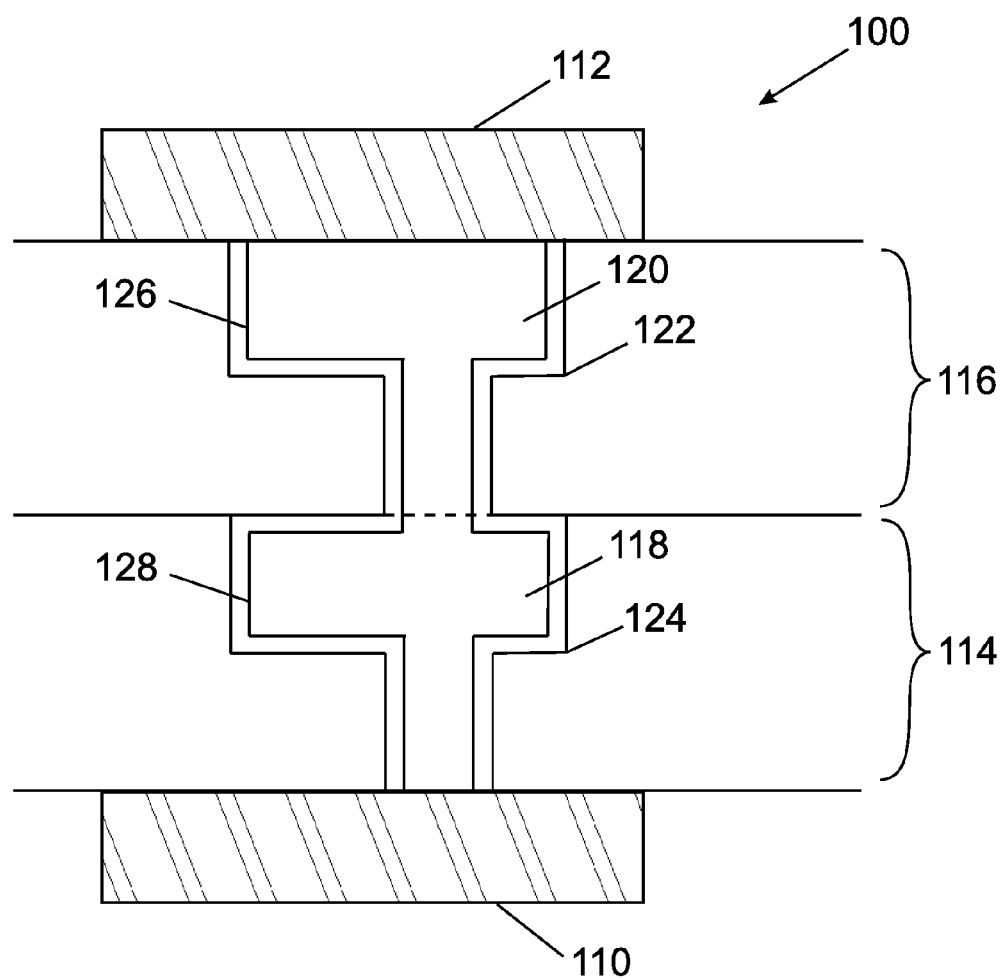
FIG. 1 is a circuit layer diagram of a first electronic integrated circuit, of the prior art.

FIG. 1 shows a layer structure 100 of an electronic integrated circuit as known in the prior art. An electronic component 110 such as a transistor or a capacitance for example is located on the bottom of the structure. Another similar electronic component 112 or a bondpad is located at the top of the structure. Layers 114 and 116 separate both components and are defined as inter-level dielectric layers. Inter-level dielectric layers 114 and 116 are made of dielectric material. Layers 114 and 116 comprise interconnects defined as metal lines 118,120 and vias 122,124. Both metal lines and vias are made of Copper or Aluminium for example. A barrier line 126, 128 forms a separation between interconnects 118, 120, 122, 124 and inter-level dielectric layer 114 and 116. The barrier liner 126, 128 is not provided at the bottom of both vias 122, 124. The deposition of such a barrier liner occurs through a well-known process called "punch through deposition barrier process".

Figure 2A:
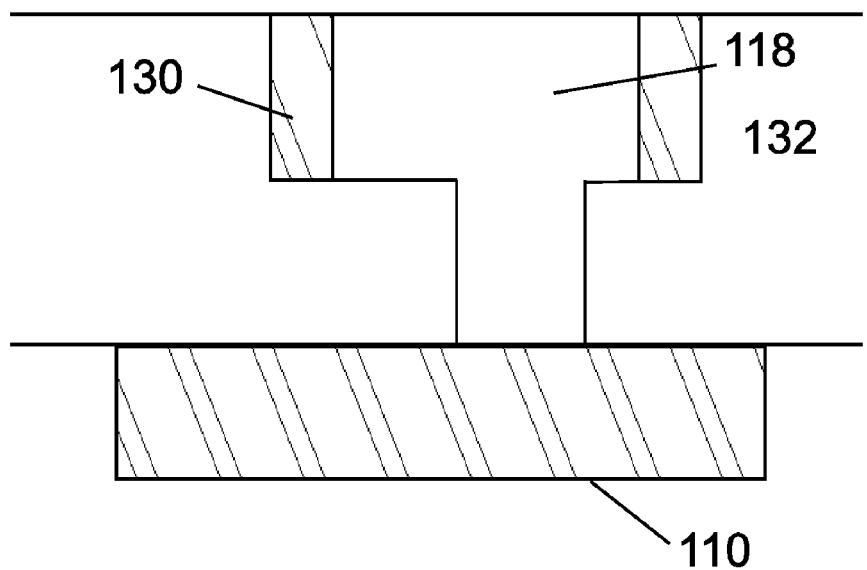
FIG. 2a is a circuit layer diagram of an electronic integrated circuit, in accordance with one embodiment of the invention, given by way of example.

FIG. 2a describes a modified structure as defined in the present invention. Metal line 118 comprises specific zones 130 and 132 on both extremities of metal line 118. The zones 130 and 132 belong to the original metal line and are called sink zones or receptor zones. Differing from prior art and original metal line, both zones can be made of a specific material called receptor material such as a porous material different from Copper or Aluminium material. The material can be for example a porous low k such as SiCOH. The function of zones 130 and 132 called receptor zones is to absorb atoms of Copper during electromigration effect when a current flows in the electronic circuit as will be described later in further details. Ideally, the material of the interconnect is already a porous dielectric material or low k material, thus no additional process steps are required. If the integration uses a non-porous dielectric the sink zones are formed by a porous low k material commonly used in industry. The sink zones must be chosen to be large enough to allow all the Copper, which migrates during the expected life of the device, to accumulate.

Figure 2B:
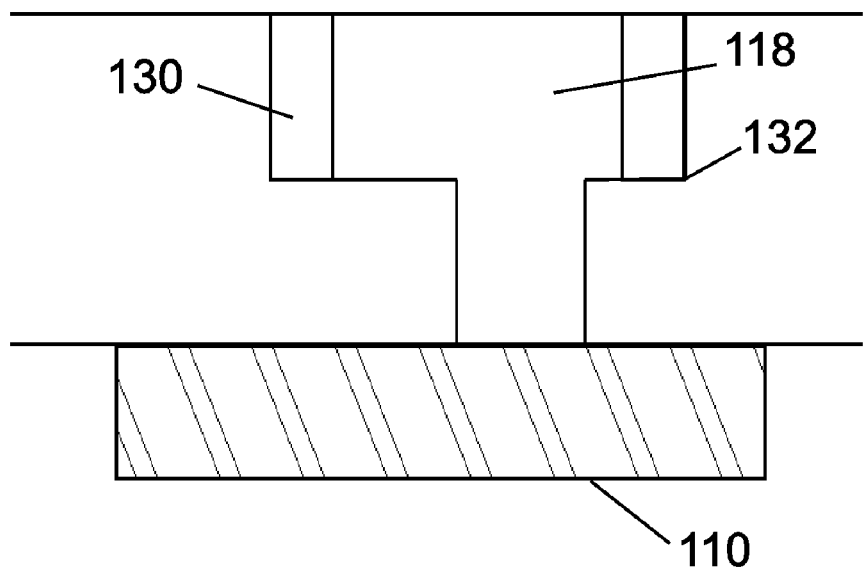
FIG. 2b is a circuit layer diagram of an electronic integrated circuit, in accordance with one embodiment of the invention, given by way of example.

As shown in FIG. 2b, an alternative modification of the original metal line 118 is to put a relatively malleable material inside zones 130 and 132 or all around the metal line 118. In this way, the malleable material can absorb atoms of Copper by extending the length of zones 130 and 132. Differing from the previous solution, as the zones are extendible with the malleable material, the zones do not show any accumulation of Copper atoms. Thus, zones 130 and 132 do not create any degradation in the electronic circuit.

Another alternative modification of the original metal line 118 is to not use any dielectric material at all, and instead use a so called airgap. In the case of airgaps, Copper atoms are free to accumulate. The distance between lines must be designed to be sufficiently large to allow accumulation without causing shorting.

Figure 3:
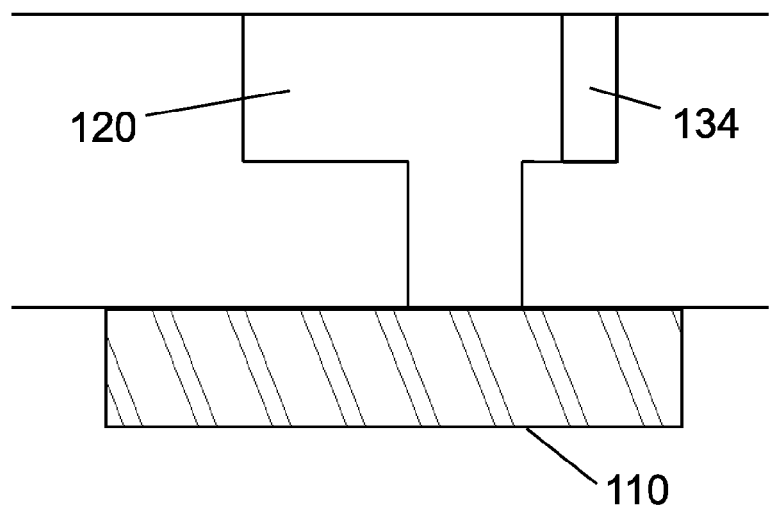
FIG. 3 is a circuit layer diagram of an electronic integrated circuit, in accordance with one embodiment of the invention, given by way of example.

FIG. 3 shows a modified structure as defined in the present invention. Metal line 120 comprises a specific zone 134. This zone 134 called the source zone or donor zone may or may not already belong to the metal line 120. This zone 134 is made of a donor material. This zone may be a bondpad made of Copper already used in the electronic circuit 100 in order to connect the circuit with an outside device. This zone 134 can also be an additional zone made of Copper. The function of the specific zone 134 is to release atoms of Copper during electromigration effect as will be described later as a result the specific zone 134 may be referred as a donor zone.

The process in accordance with the present invention includes a number of steps.

Figure 4:
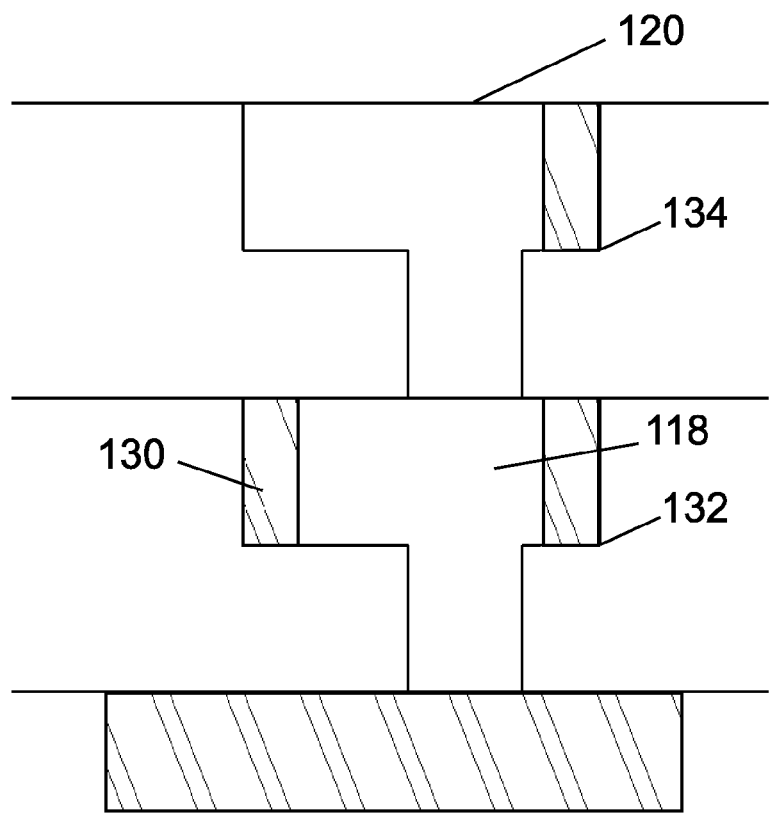
FIG. 4 is a circuit layer diagram of an electronic integrated circuit, in accordance with one embodiment of the invention, given by way of example
Figure 5:
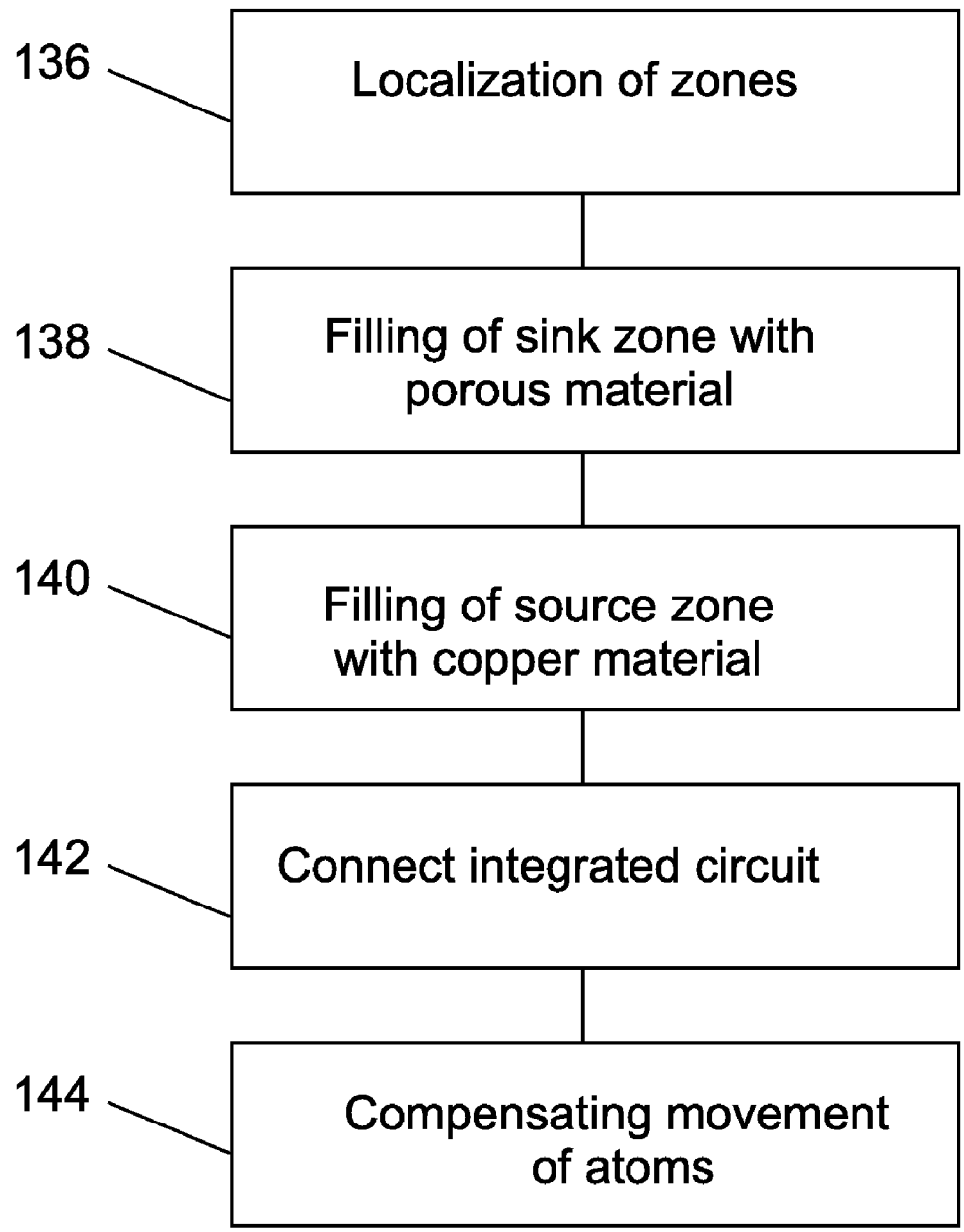
FIG. 5 is a flowchart of the method steps, in accordance with one embodiment of the invention, given by way of example.

The first step is to detect the movement of atoms of Copper in interconnects during electromigration phenomenon. A specific simulation tool, for example a tool having a three dimensional Poisson solver module can carry out the detection. The aim of the detection is to locate weakness zones around areas of high current density where atoms of Copper accumulate and/or are depleted. The zones are generally located as described in FIG. 4. As previously mentioned zones 130 and 132 refer to receptor zones where atoms of Copper generally accumulate during electromigration effect. Therefore, the process allows creation of a sink in order to receive all the Copper atoms coming into this zone when electromigration effect occurs. As previously mentioned donor zone 134 refers to a zone where atoms are depleted. Therefore, the process allows creation of a source in order to donate all Copper atoms from the source without damaging the existing Copper material of the integrated circuit. After identifying and localizing these zones, the circuit design is altered to include space for the sink zones which are then formed during the building of the device. The simulation tool also provides information on how to fill zone 134 with Copper whilst the device is built. If donor zone 134 already refers to a zone already made of Copper material such as a bond pad for example, the simulation tool does not carry out any filling up.

The behaviour of an electronic circuit, as defined in the present invention, will now be described when a current flows therein.

When a current is applied to the electronic circuit 100, atoms of Copper in the interconnects are free to move from one interconnect to another in another layer as there is no barrier liner at the bottom of the vias. Atoms of Copper move in the same direction as the flow of electrons i.e. in an opposite direction to the current. Therefore as indicated on FIG. 4, atoms of Copper migrate from metal line 120 to metal line 118. More specifically, atoms of Copper move from zone 134 to zones 130 and 132. As zone 134 is well provided with atoms of Copper through existing bond pads or through additional Copper material, zone 134 keeps a homogeneous surface. This means that no weakness, failures or cracks appear in zone 134 during electromigration process. Similarly, as zones 130 and 132 are provided with specific porous material or malleable material, this specific material can absorb all atoms of Copper coming from interconnect 118 or 120. Therefore, no accumulation occurs in zones 118 and 120. Therefore, no degradation occurs in the electronic circuit because of void formation along the interconnect or accumulation on the interconnect, at these specific zones 118 and 120.

Indeed, the present invention refers to electromigration phenomenon in an integrated circuit using a punch through barrier deposition process to avoid having a barrier liner at the bottom of vias. The present invention allows compensating movement of atoms of Copper during the electromigration phenomenon, using the barrier-free via bottom process. The modification of specific zones in the interconnects allows the creation of a compensation process in order to avoid failures in the interconnect. Specific zones are provided with corresponding specific material in order to achieve two different functions: sink function and source function. The source zone 134 allows a release of atoms of Copper without damaging the interconnect. The sink zones 130, 132 allow reception of atoms of Copper without damaging the interconnect. Therefore, electrical conductivity of electronic circuit is maintained when electromigration effect occurs.

Examples of combinations, metals, different circuits, different zones, (all or some) look at all the variations.

It will be appreciated that the examples described above are just that and many other alternatives may exist, which fall within the scope of the present invention.

The invention claimed is:

1. An integrated circuit comprising:
   an interconnect, through a dielectric layer, the interconnect comprising metallic atoms to move from a first region of the interconnect to a second region of the interconnect when a current flows, and wherein the interconnect further comprises:
   a donor zone at the first region of the interconnect that comprises an atom donor material to provide metallic atoms that compensates for movement of the metallic atoms from the first region; and
   a receptor zone at the second region of the interconnect that comprises a porous material to receive the metallic atoms that compensates for movement of the metallic atoms to the second region, wherein atom donor material is in direct contact with the porous material, and there is not an intervening diffusion barrier liner between atom donor material and the dielectric layer.

2. An integrated circuit as claimed in claim 1, wherein the atom donor material is selected from a list which includes Copper and Aluminium.

3. An integrated circuit as claimed in claim 2, wherein the first region comprises a metal line of the integrated circuit.

4. An integrated circuit as claimed in claim 2, wherein the first region comprises a bondpad of the integrated circuit.

5. An integrated circuit as claimed in claim 2, wherein the porous material is a porous low k dielectric material.

6. An integrated circuit as claimed in claim 2, wherein the second region comprises a malleable material.

7. An integrated circuit as claimed in claim 1, wherein the first region comprises a metal line of the integrated circuit.

8. An integrated circuit as claimed in claim 7, wherein the first region comprises a bondpad of the integrated circuit.

9. An integrated circuit as claimed in claim 7, wherein the porous material is a porous low k dielectric material.

10. An integrated circuit as claimed in claim 7, wherein the second region comprises a malleable material.

11. An integrated circuit as claimed in claim 1, wherein the first region comprises a bondpad of the integrated circuit.

12. An integrated circuit as claimed in claim 11, wherein the second region comprises a malleable material.

13. An integrated circuit as claimed in claim 1, wherein the porous material is a porous low k dielectric material.

14. An integrated circuit as claimed in claim 1, wherein the second region comprises a malleable material.

15. A method of manufacturing an integrated circuit, the method comprising:
    providing an integrated circuit work piece comprising an interconnect through a dielectric layer;
    locating a first and a second region at the interconnect;
    providing at the first region a donor material to create a donor zone comprising metallic atoms; and
    providing at the second region a receptor material to create a receptor zone, the receptor zone to accumulate metallic atoms from the donor zone in response to electromigration, wherein the receptor material is in contact with the metallic atoms donor material, and there is not an intervening diffusion barrier liner between the donor material and the dielectric layer.

16. A method as claimed in claim 15, wherein the donor material comprises at least one of Copper or Aluminium.

17. A method as claimed in claim 15, wherein the donor material comprises Copper.

18. A method as claimed in claim 15, wherein the receptor material is a porous low k dielectric material.

19. The method of claim 15 wherein the receptor material comprises a malleable material.

20. An integrated circuit comprising:
    an interconnect, through a dielectric layer, the interconnect comprising metallic atoms to move from a first region of the interconnect to a second region of the interconnect when a current flows, and wherein the interconnect further comprises:
        a donor zone at the first region of the interconnect that comprises an atom donor material to provide metallic atoms that compensates for movement of the metallic atoms from the first region; and
        a receptor zone at the second region of the interconnect that comprises a malleable material to receive the metallic atoms that compensates for movement of the metallic atoms to the second region, wherein donor material is in direct contact with the malleable material, and there is not an intervening diffusion barrier liner between donor material and the dielectric layer.

* * * * *